United States Patent [19]

Clark et al.

[11] Patent Number: 5,242,468

[45] Date of Patent: Sep. 7, 1993

[54] MANUFACTURE OF HIGH PRECISION ELECTRONIC COMPONENTS WITH ULTRA-HIGH PURITY LIQUIDS

[75] Inventors: R. Scot Clark, Fallbrook; Stephen S. Baird, Vista; Joe G. Hoffman, Cardiff-By-The-Sea, all of Calif.

[73] Assignee: Startec Ventures, Inc., Fallbrook, Calif.

[21] Appl. No.: 672,665

[22] Filed: Mar. 19, 1991

[51] Int. Cl.[5] .................. B08B 3/08; H01L 21/306
[52] U.S. Cl. .................. 29/25.01; 134/102.2; 134/902
[58] Field of Search .......... 55/16, 158; 202/182; 159/DIG. 27; 134/102, 902; 29/25.01; 156/345

[56] References Cited

U.S. PATENT DOCUMENTS

| | | | |
|---|---|---|---|
| 3,663,382 | 5/1972 | Garris | 203/91 |
| 3,760,822 | 9/1973 | Evans | 134/902 |
| 3,869,313 | 3/1975 | Jones et al. | 139/76 |
| 4,557,785 | 12/1985 | Ohkuma | 134/902 |
| 4,749,440 | 6/1988 | Blackwood et al. | 134/902 |
| 4,778,532 | 10/1988 | McConnell et al. | 139/10 |
| 4,788,043 | 11/1988 | Kagiyama et al. | 134/902 |
| 4,828,660 | 5/1989 | Clark et al. | 204/82 |
| 4,844,719 | 7/1989 | Toyomoto et al. | 55/16 |
| 4,855,023 | 8/1989 | Clark et al. | 423/531 |
| 4,879,041 | 11/1989 | Kurokawa et al. | 55/158 |
| 4,892,625 | 1/1990 | Shimizu et al. | 423/488 |
| 4,899,767 | 2/1990 | McConnell et al. | 134/95 |
| 4,900,395 | 2/1990 | Syverson et al. | 156/639 |
| 4,917,123 | 4/1990 | McConnell et al. | 134/95 |
| 4,936,955 | 6/1990 | Dobson et al. | 156/642 |
| 4,980,032 | 12/1990 | Dobson et al. | 156/642 |
| 4,985,228 | 1/1991 | Kirksey | 423/584 |
| 5,032,218 | 7/1991 | Dobson | 156/642 |
| 5,061,348 | 10/1991 | McCormick et al. | 156/642 |
| 5,092,937 | 3/1992 | Ogura et al. | 134/30 |

FOREIGN PATENT DOCUMENTS 0304857 1/1989 European Pat. Off. .

OTHER PUBLICATIONS

J. E. Martyak et al., "Reviewing Analytical Techniques for the Characterization of Deionized Water," *Microcontamination*, pp. 19–26, Feb. 1991.

Primary Examiner—Olik Chaudhuri
Assistant Examiner—Ourmazd S. Ojan
Attorney, Agent, or Firm—Townsend and Townsend Khourie and Crew

[57] ABSTRACT

Semiconductor wafers and other electronic parts which similarly require ultra-high purity manufacturing environments are treated with ultra-high purity liquid cleaning and etching agents prepared at the site of use from gaseous raw materials which have been purified to a level compatible with semiconductor manufacturing standards, combined when appropriate with ultra-pure water.

11 Claims, 8 Drawing Sheets

MANUFACTURE OF HIGH PRECISION ELECTRONIC COMPONENTS WITH ULTRA-HIGH PURITY LIQUIDS

This invention lies in the field of high-precision electronic components, and relates to the preparation and handling of the liquid chemicals used in the manufacture of such components at various stages of the manufacturing process.

BACKGROUND OF THE INVENTION

A major concern at every stage in the manufacture of electronic components is contamination. Control of contamination is critical to product quality, and an extremely high level of cleanliness and purity in the manufacturing environment is needed for obtaining acceptable product yield and maintaining profitability. These requirements are particularly acute in the manufacture of very high density circuitry as well as in ultra-precision bearings, recording heads and LCD displays.

Sources of contamination include the manufacturing facility, personnel and processing equipment. In many cases, contamination can be lowered to acceptable levels by the use of "clean room" techniques such as isolation, air filtration, special equipment and special clothing and body coverings to avoid contact between the operator and the manufacturing materials. With ultra-high precision manufacturing, the highest levels at which defects can be tolerated are particularly low and control over sources of contamination is even more critical.

A problematic source of contamination in ultra-high precision manufacturing is the liquid chemicals used in the manufacturing process. Cleaning and etching agents and other treatment chemicals must be extremely pure and free of particulate matter to produce acceptable product in high yield. Chemicals brought in from outside sources, however, contain inherent contamination which they bring to the manufacturing area. Contamination is contributed by the preparation of the chemicals, the packaging in which the chemicals are shipped as well as the packaging operation, the handling the chemicals receive during transfer from the manufacturer, and decay of the chemicals in the packaging during shipment or storage.

Further difficulties arise in those procedures which require treatment chemicals which do not meet Department of Transportation regulations, and therefore cannot be shipped in a manner which requires conformance with these regulations Examples are nitric acid at concentrations exceeding 70%, high-purity oleum, ammonium hydroxide at concentrations exceeding 28%, and hydrogen peroxide without stabilizers.

Clearly there is a need for a reliable means of supplying these treatment chemicals at a purity level which will produce a high yield of acceptable product in ultra-high precision components, and which can meet the requirements of advancing electronics technology.

SUMMARY OF THE INVENTION

A system for supplying liquid chemicals of ultra-high purity to a production line for high-precision electronic devices has now been developed. The treatment chemicals are prepared at the site of use in a production facility, providing a high level of control over the manufacturing process and the purity and composition of the treatment chemicals, which in turn allows the manufacture of extremely high density semiconductors with a high yield of acceptable products. According to this invention, the liquid treatment chemicals are prepared at the point of and immediately prior to their use, from gaseous starting materials which have been purified to a level compatible with semiconductor manufacturing standards. The chemicals are prepared directly at the concentrations and dilutions in which they will be used in the treatments, without the need for packaging or transport, or the need for mixing these chemicals with diluents, solvents or other chemicals which are potential sources of contamination.

Preparation of a treatment chemical in accordance with this invention consists of reacting a purified gaseous starting material with other materials, gaseous or liquid, which have been similarly purified to achieve the desired liquid product. This may involve contacting the gaseous starting material with a mist or stream of highly purified water or other liquid to form a liquid solution, or reacting the gaseous starting material with other highly purified gaseous or liquid materials to produce a product which is itself liquid or immediately dissolved in a liquid solvent. The resulting high-purity treatment liquid is then passed directly to a workstation on the production line, where the treatment liquid contacts the surface of the workpiece to serve its intended function with no intervening exposure to potential sources of contamination such as storage and shipping containers and less than ultra-clean environments.

This invention is applicable to processing and cleaning liquids in general, with particular applicability to cleaning solutions, developing solutions, etching solutions and stripping solutions, and permits treatment of the workpiece in a manner which is free of contamination, to result in a product free of defects. In this manner, semiconductors with extremely detailed, concentrated and accurate circuitry, bearings, glasses and other materials whose performance relies on high precision can be prepared in high yield.

DETAILED DESCRIPTION OF THE INVENTION PREFERRED EMBODIMENTS

While the types of treatment chemicals which can be prepared and utilized, and the types of electronic components which can be treated and manufactured within the scope of this invention are wide and varied, the invention may be best understood by examining a specific example. Accordingly, FIG. 1 illustrates the application of the concept of the invention to semiconductor fabrication.

Conventional workstations in the production line include a wafer cleaning station 11, a coating station 12 for applying photoresist to the wafer, an alignment station 13 for positioning the photomask over the wafer and exposing the wafer through the mask reticle, a developing station 14 for removing the photoresist exposed through the mask, thereby leaving a photoresist mask, an etching station 15 for etching away the silicon dioxide exposed by the photoresist mask, and a stripping station 16 for removing the photoresist mask. Intermediate stages not shown may include rinsing stations, curing stations and inspection stations. The wafer or wafer batch 17 will be held on a wafer support 18, and conveyed from one station to the next by a robot 19 or some other conventional means of achieving sequential treatment.

Figure 1:
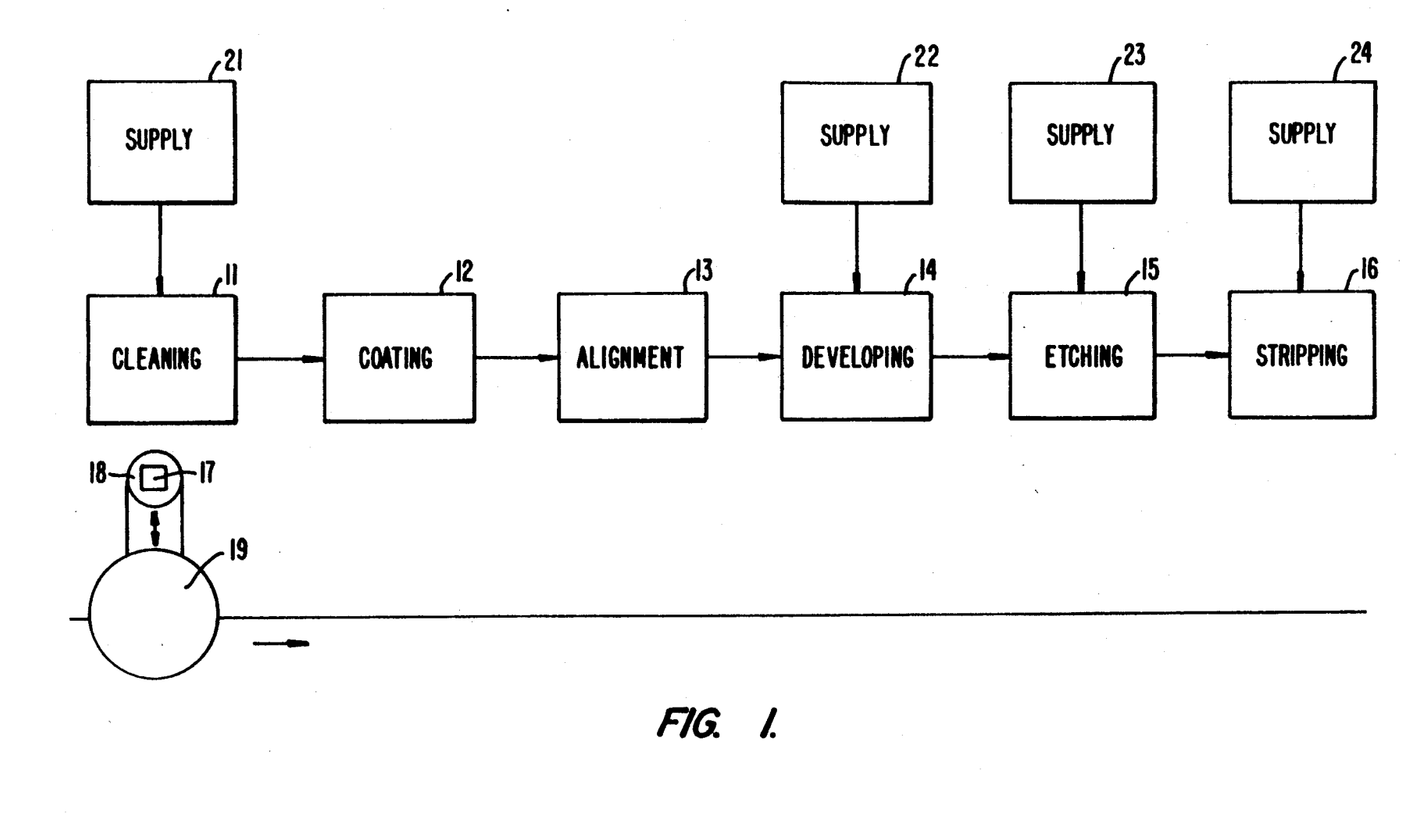
FIG. 1 is a block diagram of semiconductor fabrication line serving as one example of an implementation of the present invention.

Liquid treatment chemicals used at various stages workstations are supplied in accordance with this invention by subunits 21, 22, 23 and 24, shown in FIG. 1 as supplying the workstations for cleaning 11, developing 14, etching 15 and stripping 16, respectively. One, several or all of such subunits may be employed in a single production line, and the chemical supplied by any such unit will be selected in accordance with the types of materials used in the semiconductor fabrication.

Each subunit will be positioned in close proximity to the point of use of the treatment chemical in the production line. The chemical can therefore be directly applied to the semiconductor substrate without packaging or transport and without storage other than possibly a small in-line reservoir, and thus without contact with the potential sources of contamination normally encountered when chemicals are manufactured and prepared for use at locations external to the manufacturing facility. The distance between the point of formation of the chemical and its point of use will generally be less than about one foot (30 cm). Transfer can be achieved through an ultra-clean transfer line of a material which does not introduce contamination In most applications, stainless steel or polymers such as high density polyethylene or fluorinated polymers can be used successfully.

The scale of each subunit will be small so that it will be comparable to that of the fabrication process and production line in which the liquid chemical will be used. The rate of production of the chemical by the subunit will accordingly be approximately equal to the rate at which the chemical is used in the process and applied to the wafer. This will vary of course with the scale of the fabrication process and the rate at which the wafers or other electronic components) are fabricated. in most cases, however, the production rate will range from about 200 cc to about two liters per hour, preferably from about 500 cc to about 1 liter per hour.

The gaseous raw materials will be selected in accordance with the process employed by the subunit to produce the desired treatment chemical. A wide range of gaseous materials may therefore be used. Examples are ammonia, hydrogen fluoride, hydrogen chloride, hydrogen bromide, phosphine, arsine, diborane and sulfur dioxide.

The gaseous raw materials can be purified for use in accordance with this invention by such techniques as fractional distillation, particularly vacuum distillation, microfiltration or ultrafiltration, ion gettering, chromatographic extraction, electrodialysis or ion exchange. Distillation can be performed by conventional methods reduced to a small scale, while filtration can be performed using known membranes designed for the removal of particles down to extremely small size. In preferred embodiments of the invention, filtration is performed to remove particles greater than about 0.005 micron. The ability to achieve the desired degree of purification of the treatment chemical by purifying the raw material in the gaseous phase permits a much higher degree of purification, since gases can be filtered to a much finer particle size than liquids.

In many cases, the gaseous raw materials can be prepared in the subunit itself, further enhancing the purity of the gas. Primary means for achieving gases of high concentration and purity are electrochemical cells or heterogeneous reactions. With electrolytic cells, one or both of the electrolysis products may find utility in the subunit operations.

Water is used as a raw material in various subunits in accordance with the invention. The proximity of the subunit to the production line permits the use of water which has been purified in accordance with semiconductor manufacturing standards. These standards are commonly used in the semiconductor industry and well known among those skilled in the art and experienced in the industry practices and standards. Methods of purifying water in accordance with these standards include ion exchange and reverse osmosis. Ion exchange methods typically include most or all of the following units: chemical treatment such as chlorination to kill organisms; sand filtration for particle removal; activated charcoal filtration to remove chlorine and traces of organic matter; diatomaceous earth filtration; anion exchange to remove strongly ionized acids; mixed bed polishing, containing both cation and anion exchange resins, to remove further ions; sterilization, involving chlorination or ultraviolet light; and filtration through a filter of 0.45 micron or less. Reverse osmosis methods will involve, in place of one or more of the units in the ion exchange process, the passage of the water under pressure through a selectively permeable membrane which does not pass many of the dissolved or suspended substances Typical standards for the purity of the water resulting from these processes are a resistivity of at least about 15 megohm-cm at 25° C. (typically 18 megohm-cm at 25° C.), less than about 25 ppb of electrolytes, a particulate content of less than about 150/cm$^3$ and a particle size of less than 0.2 micron, a microorganism content of less than about 10/cm$^3$, and total organic carbon of less than 100 ppb.

The conversion of the raw materials to the treatment chemical may involve any physical and/or chemical transformation required to produce the liquid product. Physical transformations may include a simple dissolving of the gaseous raw material in high purity water or other liquid or solvent, or a mixing of gaseous raw materials while simultaneously dissolving them in the solvent. Chemical transformations will involve a reaction between gaseous reactants, including reactions induced by high temperature or flame, or by contact with a catalyst. Known reactions will be used for these transformations, the difference residing in the use of ultra-high purity gaseous materials and water and the performance of these reactions on-stream in a semiconductor production line.

Treatment chemicals to be prepared and used in accordance with the present invention include the wide variety of etching and cleaning solutions used in semiconductor manufacture at various stages in the manufacturing process. Examples are aqueous hydrofluoric acid (HF), aqueous ammonium fluoride ($NH_4F$), aqueous ammonium bifluoride ($NH_4HF_2$), hydrogen peroxide, aqueous nitric acid ($HNO_3$), fuming nitric acid ($HNO_3$), aqueous phosphoric acid ($H_3PO_4$), sulfuric acid ($H_2SO_4$), and aqueous hydrochloric acid (HCl); and various combinations such as buffered oxide etch (BOE) and other aqueous combinations of ammonium fluoride and hydrofluoric acid at various mole ratios and concentrations, aqueous combinations of hydrofluoric and nitric acids, aqueous combinations of phosphoric and nitric acids, aqueous combinations of sulfuric acid and hydrogen peroxide, aqueous combinations of hydrochloric acid and hydrogen peroxide, and aqueous combinations of ammonium hydroxide and hydrogen peroxide.

FIGS. 2 through 8 illustrate various subunits for preparing and supplying liquid chemicals at the point of use in accordance with this invention.

Figure 2:
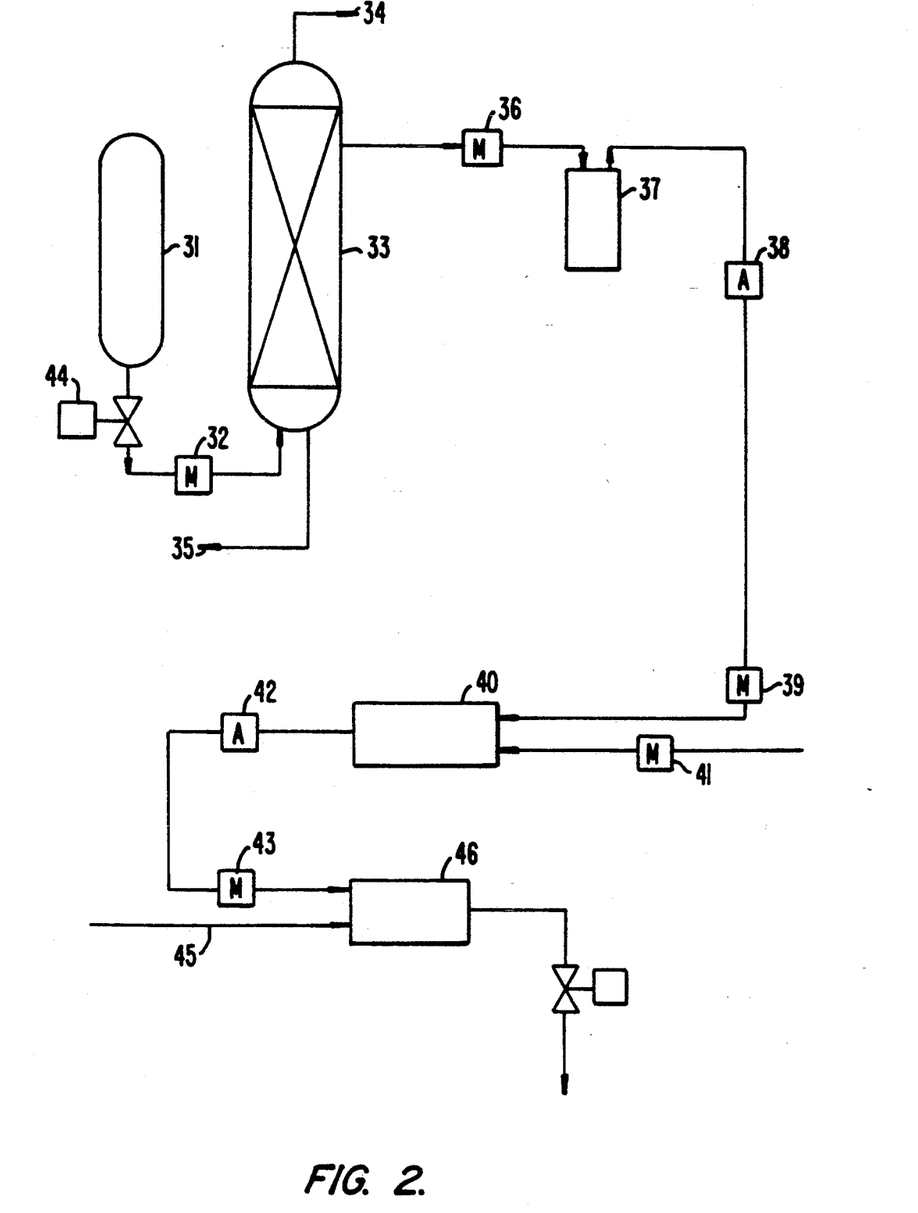
FIG. 2 is an engineering flow diagram of a subunit for the production and introduction of ammonium hydroxide or ammonium hydroxide combined with hydrogen peroxide.

The subunit of FIG. 2 produces ammonium hydroxide or a mixture of ammonium hydroxide and hydrogen peroxide from ammonia. Ammonia is supplied by an ammonia cylinder 31, through a mass flow controller 32 to a fractionating column 33 with off-streams for vent gases 34 and for heavy ends 35. Purified ammonia leaving the column passes through a further mass flow controller 36 to a purifier membrane 37, where the particulate content is reduced to a very low level. The emerging ammonia is then passed through an analyzer module 38 and a further mass flow controller 39 to a mist contactor 40, where the ammonia is contacted with a mist of ultra-pure water entering through a further mass flow controller 41, to form liquid ammonium hydroxide. A still further analyzer 42 and mass flow controller 43 on the product line govern the flow rate through the subunit by signal transmission to a computer or other conventional controller which controls the operation of such instruments as the remote operating valve 44 on the ammonia source 31. The aqueous ammonium hydroxide is combined with purified hydrogen peroxide 45 in a suitable mixer unit 46, whose output is fed directly to the point of use on the semiconductor fabrication line.

Figure 3:
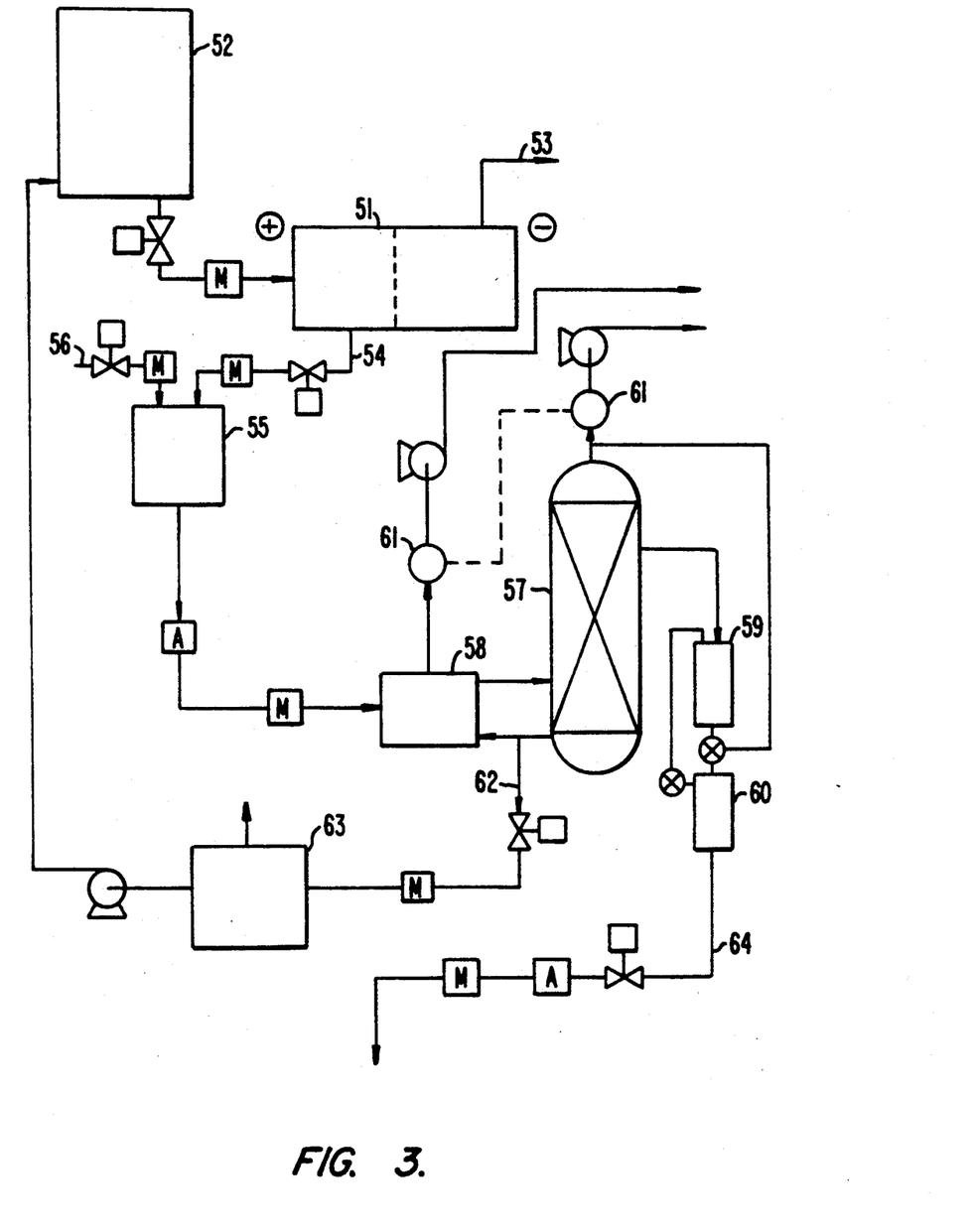
FIG. 3 is an engineering flow diagram of a subunit for the production of hydrogen peroxide.

The subunit of FIG. 3 produces hydrogen peroxide. An electrolysis cell 51 is fed by sulfuric acid from a reservoir 52. Hydrogen gas 53 is released from the cathode while the anolyte 54, which is a mixture of sulfuric acid and persulfuric acid, is drawn off and fed to a diluter 55 where it is combined with ultra-pure water 56. The resulting aqueous solution is fed to a fractionating column 57 operating under vacuum, equipped with a recirculation boiler 58 and peroxide receivers 59, 60. Vacuum controllers 61 maintain the vacuum in the column and reboiler. Sulfuric acid 62 leaving the bottom of the column is recycled to the reservoir 52 through an evaporator 63 which removes moisture, and the product peroxide 64 passes directly to the point of use. In this and the following Figure descriptions, in-line analyzers and mass flow controllers, although not individually identified in the description, are included as they are in FIG. 2.

Alternate subunits for producing hydrogen peroxide can involve the formation of hydrogen peroxide by hydrolysis of barium peroxide, potassium superoxide or other metallic peroxides, the hydrogen peroxide then being directed to the fractionating column 57.

Figure 4:
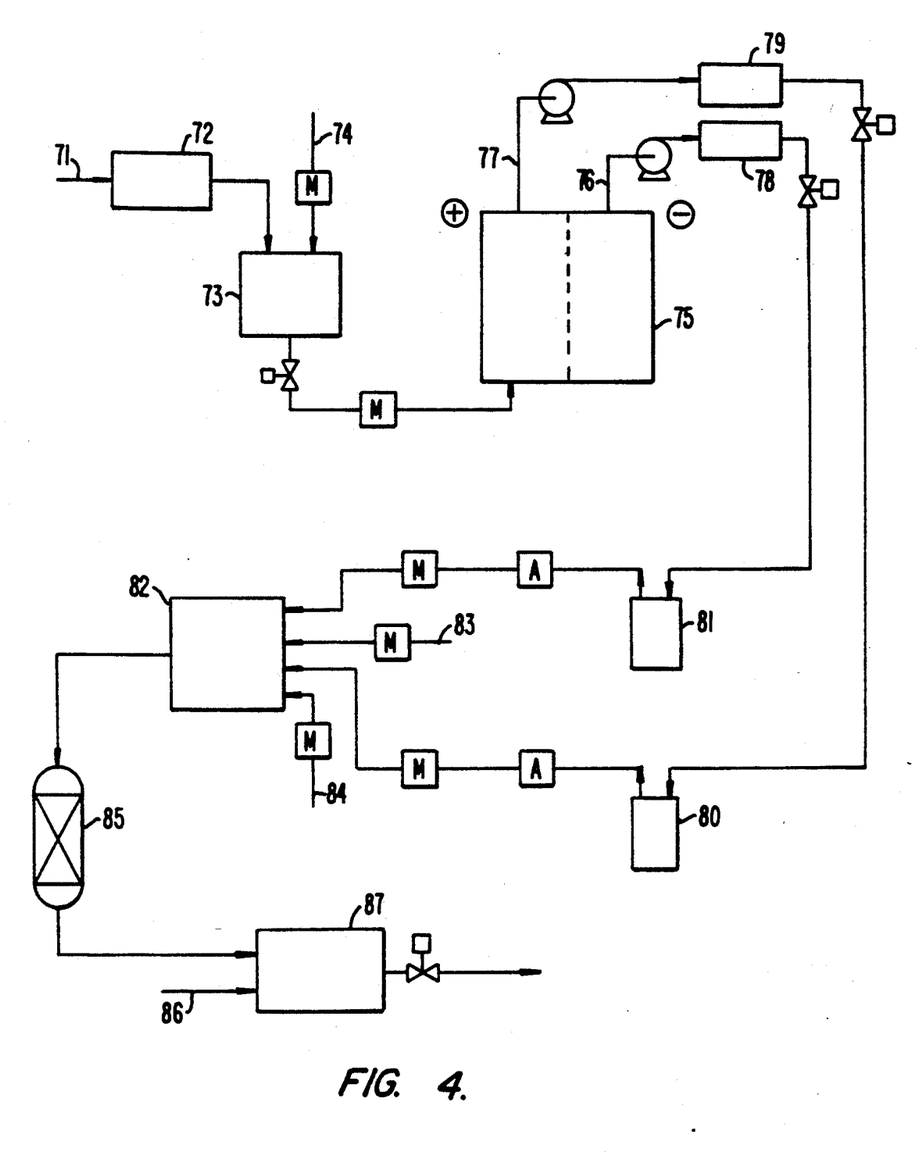
FIG. 4 is an engineering flow diagram of a subunit for the production of hydrochloric acid.

FIG. 4 depicts a subunit for hydrochloric acid. A chloride salt 71 such as $CaCl_2$, $MgCl_2$, NaCl, KCl, CsCl or other water-soluble cation chloride is fed through a solids metering device 72 to a dissolving vessel 73, where it is combined with ultra-pure water 74. The resulting solution is fed to an electrolysis cell 75 which produces hydrogen gas 76 at the cathode and chlorine gas 77 at the anode, each of which is retained temporarily by a holding tank 78, 79, respectively. From the holding tank, each gas is fed through a purifier membrane 80, 81, from which the gases pass into a burner 82 where they are combined with additional purified hydrogen 83 and purified air 84. The burner output passes through a condenser 85, and the resulting hydrochloric acid is combined with hydrogen peroxide 86 in a mixing unit 87, the product of which passes directly to the point of use.

Figure 5:
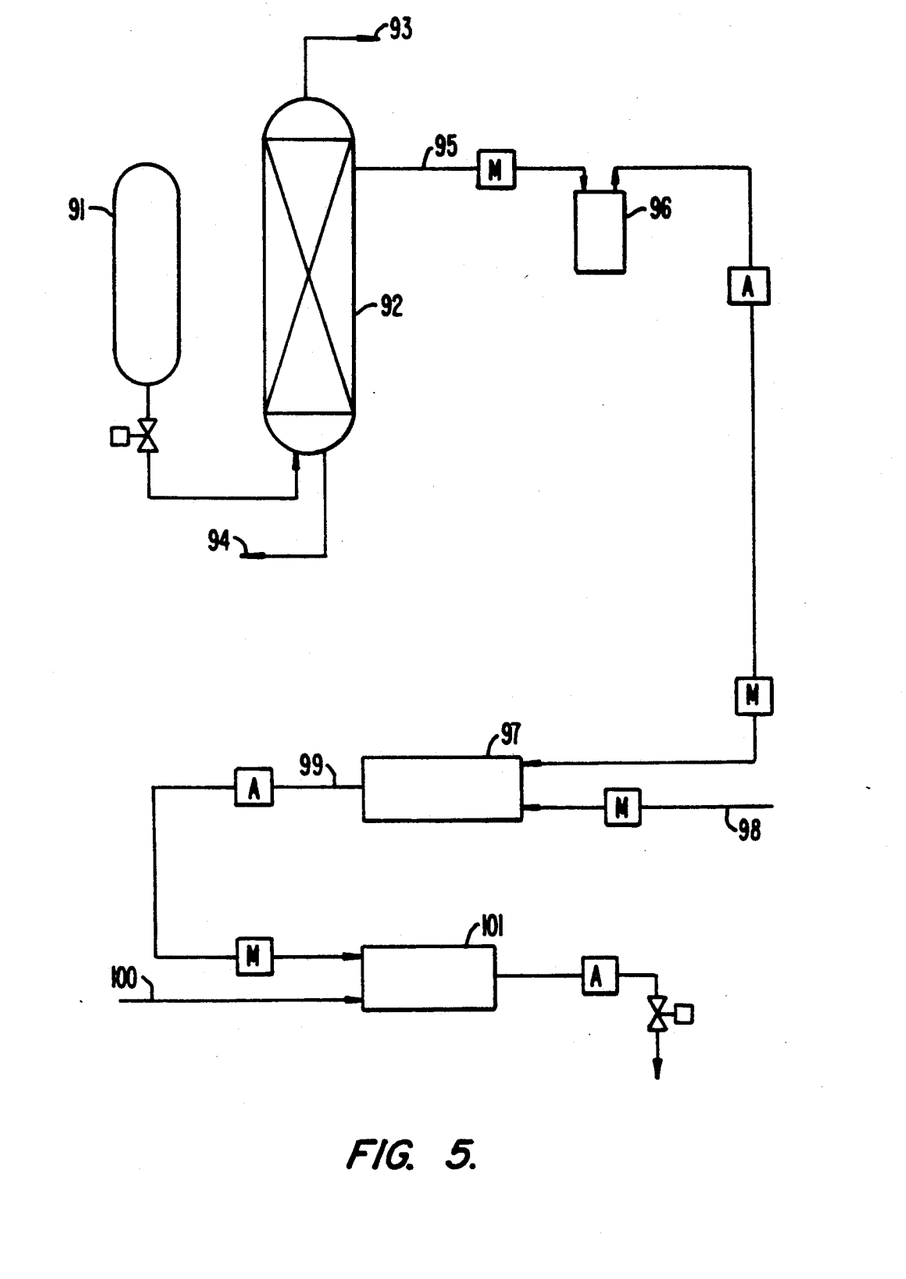
FIG. 5 is an engineering flow diagram of an alternative subunit for the production of hydrochloric acid.

An alternative hydrochloric acid subunit is depicted in FIG. 5. Here, hydrogen chloride is supplied as a nonaqueous liquid from a cylinder 91 to a fractionating column 92 with off-streams for vent gases 93 and heavy ends 94. The purified hydrogen chloride gas 95 emerging from the column is passed through a filter membrane 96 to a mist contactor 97 where it is combined with a mist of purified water 98. The resulting aqueous hydrochloric acid 99 may be combined with purified hydrogen peroxide 100 in a mixing unit 101 to form a hydrochloric acid/hydrogen peroxide mixture which is passed directly to the point of use.

Figure 6:
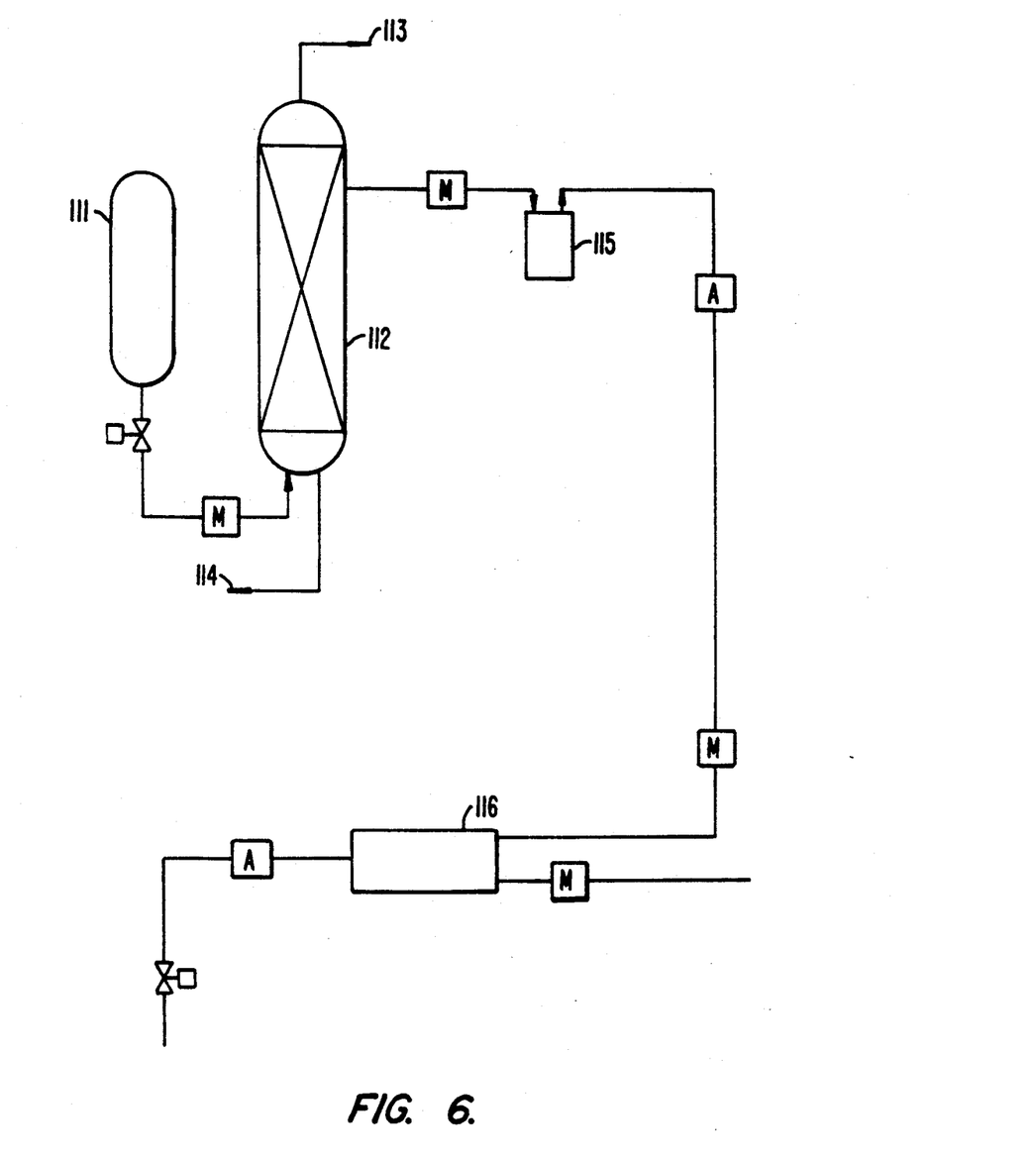
FIG. 6 is an engineering flow diagram of a subunit for the production of hydrofluoric acid

FIG. 6 depicts a subunit for hydrofluoric acid. The flow scheme is similar to that of FIG. 5, with a liquid hydrogen fluoride cylinder 111, a fractionating column 112, off-streams for vent gases 113 and heavy ends 114, a membrane filter 115 and mist contactor 116.

Alternatives to a hydrogen fluoride cylinder are reactions between calcium fluoride and sulfuric acid, which are performed at a suitable temperature which will be known to those skilled in the art. The effluent hydrogen fluoride will then directed to fractionating column 112 for purification.

Figure 7:
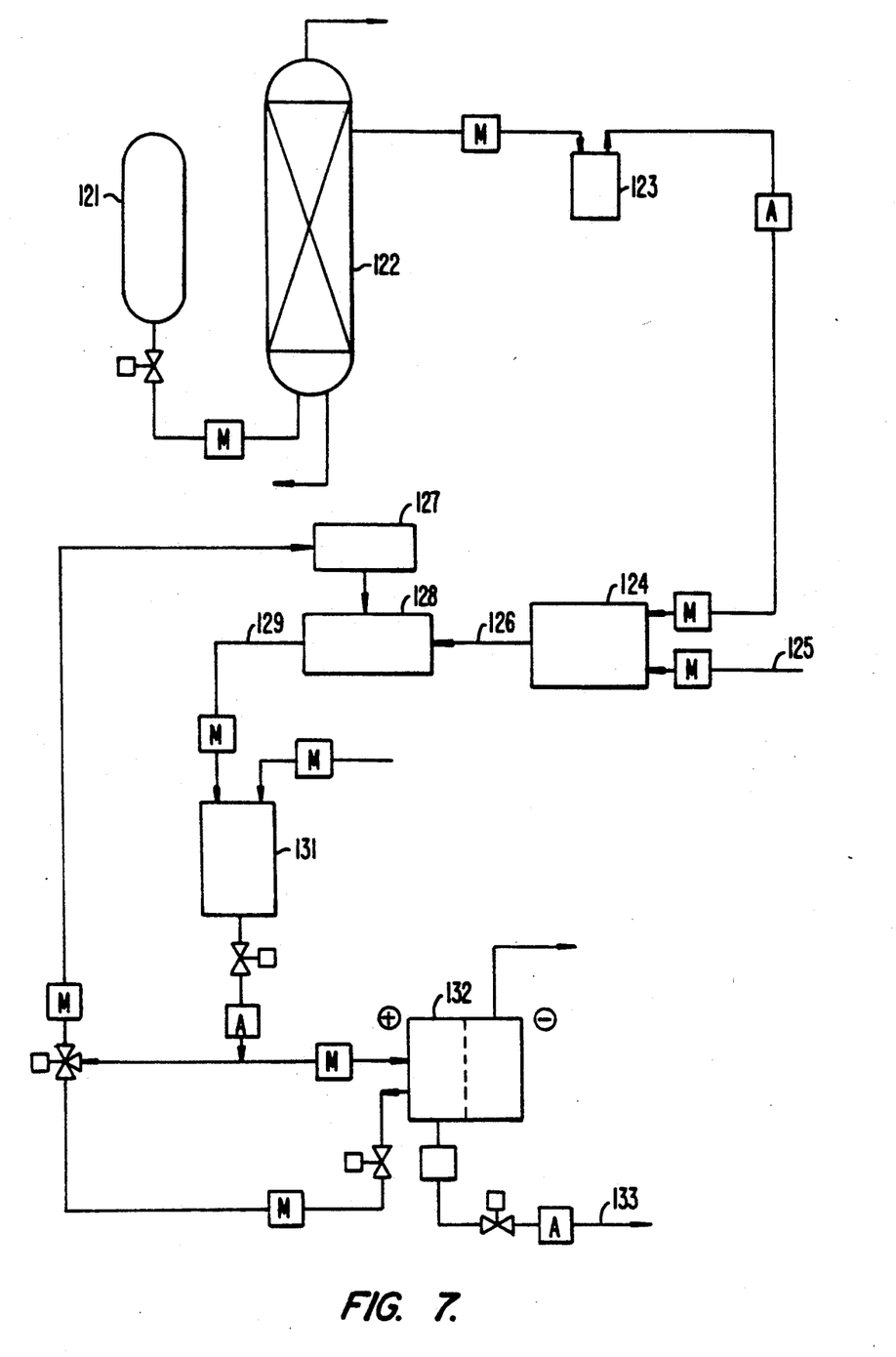
FIG. 7 is an engineering flow diagram of a subunit for the production of sulfuric acid.

FIG. 7 depicts a subunit for sulfuric acid. Liquid sulfur dioxide is supplied by a cylinder 121 to a fractionating column 122 and then to a membrane filter 123. The purified sulfur dioxide gas is then fed to a catalytic oxidizer 124 where it is combined with purified air 125 over a platinum or other suitable catalyst to produce sulfur trioxide 126. The sulfur trioxide is combined with purified sulfuric acid 127 in an absorber 128 to form ultra-pure oleum 129, which is subsequently diluted with ultra-pure water 130 in a diluting vessel 131. An electrolysis cell 132 then converts this diluted oleum to a mixture of sulfuric and persulfuric acids 133. recycling some of the sulfuric acid back to the absorber 128. As in the other subunits, the product mixture is ready for application directly to the point of use on the fabrication line.

Figure 8:
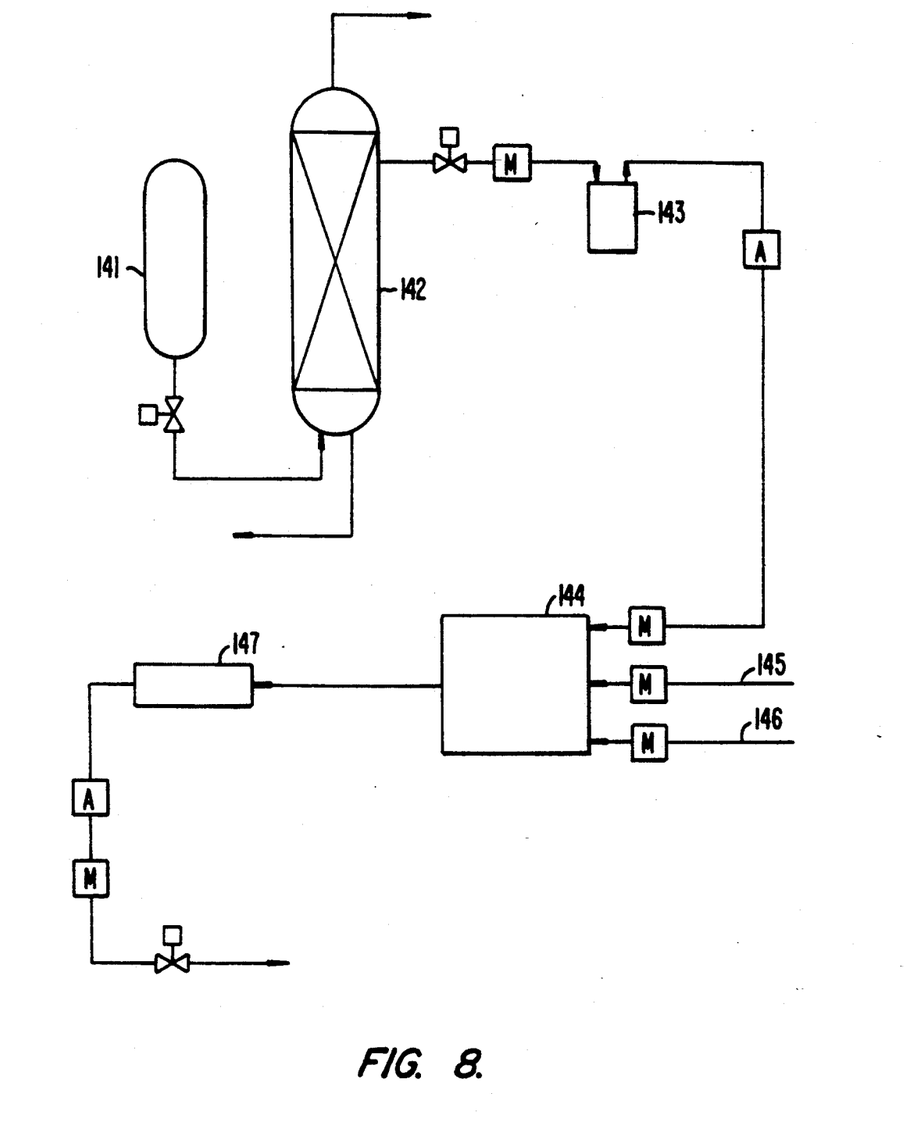
FIG. 8 is an engineering flow diagram of a subunit for the production of nitric acid.

Nitric acid is prepared in the subunit depicted in FIG. 8. A cylinder 141 supplies liquid ammonia to a fractionating column 142, from which the resulting ammonia gas is passed to a membrane filter 143. The purified ammonia gas emerging from the membrane is then passed to a catalytic oxidizer 144 where it is combined over a platinum, platinum-rhodium, base metal or other suitable catalyst with purified hydrogen gas 145 and purified air 146. The product nitric acid gas passes to a condenser 147, and from there to its point of use.

These are merely examples; other flow schemes for preparing other treatment chemicals will readily occur to those skilled in the art. For example, aqueous phosphoric acid may be formed by combining phosphine, hydrogen and oxygen gases, all highly purified, and burning them in a flame at a high flame temperature, followed by condensing the product. The product is aqueous phosphoric acid at a concentration determined by the amount of hydrogen gas included in the reactant mixture. A phosphine stream containing 49% hydrogen, for example, will result in a condensate having a phosphoric acid concentration of 85%. Added advantages of this process are that the presence of hydrogen in the phosphine stream assures a stable flame in the burner, a sufficiently high flame temperature to assure complete combustion of the phosphine, and the prevention of smoke formation due to the simultaneous production of water in the flame.

In all subunits and flow schemes, a high degree of control over the product concentration and hence flow rates is achieved by precise monitoring and metering using known equipment and instrumentation. Hydrogen fluoride or phosphoric acid for example may be monitored to a high degree of accuracy by the use of a conductivity cell, ammonia by vapor pressure measurement, hydrochloric acid by a chloride electrode on a pH detector or other electrochemical device, $NH_4HF_2$ by refractive index, and sulfuric acid by density.

Conventional equipment and methods may be used for each of the component units and elements shown in these flow diagrams. All materials of construction will be of ultra-high cleanliness, free of extraneous materials such as lubricants, fluxes and oxides, and noncorrosive and not susceptible to deterioration. The small scale of each these elements permits high quality materials to be used.

In addition to its ability to produce extremely high purity treatment chemicals and thereby render possible the manufacture of extremely high precision and high density electronic and semiconductor components, the process of the present invention in its various embodiments offers still further advantages. For example, the number and type of chemicals which must be stored and readily available for semiconductor manufacture is reduced by virtue of this invention. There is no longer any need to retain stock quantities of different dilutions of a particular treatment chemical, and a single raw material may be useful in the preparation of a variety of treatment chemicals. As a further example, liquid treatment chemicals can be prepared according to this invention in the quantities of the scale in which they are to be used.

The foregoing is offered primarily for purposes of illustration. It will be readily apparent to those skilled in the art that further modifications, substitutions and variations of various kinds can be made in terms of the many system parameters discussed above without departing from the spirit and scope of the invention.

What is claimed is:

1. A system for the manufacture of a high-precision electronic component, said system comprising:
    (a) a production line containing a plurality of workstations successively arranged for treating a workpiece to be formed into said electronic component, one such workstation selected for application of a liquid treatment agent to said workpiece;
    (b) means for conveying said workpiece to said workstations in succession along said production line; and
    (c) a subunit adjoining said production line at said selected workstation to supply said liquid treatment agent in ultra-high purity form, said subunit supplied by raw materials including a gaseous raw material selected from the group consisting of ammonia, hydrogen fluoride, hydrogen chloride, hydrogen bromide, phosphine, arsine, diborane and sulfur dioxide, and said subunit comprising:
        (i) means for purifying said gaseous raw material to a purity compatible with semiconductor manufacturing standards defined as a resistivity of at least about 15 megohm-cm at 25° C., less than about 25 ppb of electrolytes other than said raw material itself, a particulate content of less than about $150/cm^3$ and a particle size of less than 0.2 micron, a microorganism content of less than about $10/cm^3$, and total organic carbon of less than 100 ppb;
        (ii) means for combining said gaseous raw material so purified with further raw material of a purity compatible with said semiconductor manufacturing standards, under conditions such that said gaseous raw material and said further raw material are converted to said ultra-high purity liquid treatment agent at a rate approximately equal to that at which said liquid treatment agent will be applied to a workpiece; and
        (iii) means for applying said ultra-high purity liquid treatment agent thus formed directly to a workpiece at said workstation;
    said production line, said conveying means and said subunit all being contained in an environment maintained free of contamination by said semiconductor manufacturing standards.

2. A system for the manufacture of a high-precision electronic component, said system comprising:
    (a) a production line containing a plurality of workstations successively arranged for treating a workpiece to be formed into said electronic component, one such workstation selected for application of a liquid treatment agent to said workpiece;
    (b) means for conveying said workpiece to said workstations in succession along said production line; and
    (c) a subunit adjoining said production line at said selected workstation to supply said liquid treatment agent in ultra-high purity form, said subunit supplied by raw materials including a gaseous raw material and comprising:
        (i) means for purifying said gaseous raw material to a purity compatible with semiconductor manufacturing standards defined as a resistivity of at least about 15 megohm-cm at 25° C., less than about 25 ppb of electrolytes other than said raw material itself, a particulate content of less than about $150/cm^3$ and a particle size of less than 0.2 micron, a microorganism content of less than about $10/cm^3$, and total organic carbon of less than 100 ppb, said means for purifying said gaseous raw material including a filtration membrane removing particles greater than 0.005 micron;
        (ii) means for combining said gaseous raw material so purified with further raw material of a purity compatible with said semiconductor manufacturing standards, under conditions such that said gaseous raw material and said further raw material are converted to said ultra-high purity liquid treatment agent at a rate approximately equal to that at which said liquid treatment agent will be applied to a workpiece; and (iii) means for applying said ultra-high purity liquid treatment agent thus formed directly to a workpiece at said workstation;

said production line, said conveying means and said subunit all being contained in an environment maintained free of contamination by said semiconductor manufacturing standards.

3. A system for the manufacture of a high-precision electronic component, said system comprising:
   (a) a production line containing a plurality of workstations successively arranged for treating a workpiece to be formed into said electronic component, one such workstation selected for application of a liquid treatment agent to said workpiece;
   (b) means for conveying said workpiece to said workstations in succession along said production line; and
   (c) a subunit adjoining said production line at said selected workstation to supply said liquid treatment agent in ultra-high purity form, said subunit supplied by raw materials including a gaseous raw material and comprising:
      (i) means for purifying said gaseous raw material to a purity compatible with semiconductor manufacturing standards defined as a resistivity of at least about 15 megohm-cm at 25° C., less than about 25 ppb of electrolytes other than said raw material itself, a particulate content of less than about 150/cm$^3$ and a particle size of less than 0.2 micron, a microorganism content of less than about 10/ cm$^3$, and total organic carbon of less than 100 ppb;
      (ii) means for combining said gaseous raw material so purified with further raw material of a purity compatible with said semiconductor manufacturing standards, under conditions such that said gaseous raw material and said further raw material are converted to said ultra-high purity liquid treatment agent at a rate approximately equal to that at which said liquid treatment agent will be applied to a workpiece, and such that said ultra-high purity liquid treatment agent is produced at a rate of from about 200 cc/h to about 2L/h; and
      (iii) means for applying said ultra-high purity liquid treatment agent thus formed directly to a workpiece at said workstation;

said production line, said conveying means and said subunit all being contained in an environment maintained free of contamination by said semiconductor manufacturing standards.

4. A system for the manufacture of a high-precision electronic component, said system comprising:
   (a) a production line containing a plurality of workstations successively arranged for treating a workpiece to be formed into said electronic component, one such workstation selected for application of a liquid treatment agent to said workpiece;
   (b) means for conveying said workpiece to said workstations in succession along said production line; and
   (c) a subunit adjoining said production line at said selected workstation to supply said liquid treatment agent in ultra-high purity form, said subunit supplied by raw materials including a gaseous raw material and comprising:
      (i) means for forming said gaseous raw material by electrolysis of a liquid
      (ii) means for purifying said gaseous raw material to a purity compatible with semiconductor manufacturing standards defined as a resistivity of at least about 15 megohm-cm at 25° C., less than about 25 ppb of electrolytes other than said raw material itself, a particulate content of less than about 150 cm$^3$ and a particle size of less than 0.2 micron, a microorganism content of less than about 10cm$^3$, and total organic carbon of less than 100 ppb;
      (iii) means for combining said gaseous raw material so purified with further raw material of a purity compatible with said semiconductor manufacturing standards, under conditions such that said gaseous raw material and said further raw material are converted to said ultra-high purity liquid treatment agent at a rate approximately equal to that at which said liquid treatment agent will be applied to a workpiece; and
      (iv) means for applying said ultra-high purity liquid treatment agent thus formed directly to a workpiece at said workstation;

said production line, said conveying means and said subunit all being contained in an environment maintained free of contamination by said semiconductor manufacturing standards.

5. A system in accordance with claims 1, 2 or 3 in which said means for purifying said gaseous raw material is a fractional distillation column, a microfiltration or ultrafiltration membrane, or a combination thereof.

6. A system in accordance with claim 1, 2, 3 or 4 in which said further raw material is a member selected from the group consisting of ultra-high purity water, $H_2SO_4$, hydrogen gas and air.

7. A system in accordance with claims 1, 2, 3 or 4 in which said gaseous raw material is defined as a first gaseous raw material, and said further raw material comprises water plus a second gaseous raw material of a purity substantially equal to that of said first gaseous raw material.

8. A system in accordance with claims 1, 2, 3 or 4 in which said means for combining said gaseous raw material and said further raw material are positioned within approximately 30 cm of said means for applying said ultra-high purity liquid treatment agent to said workpiece, along said production line.

9. A system in accordance with claims 1, 2, 3 or 4 in which components (ii) and (iii) of said subunit are arranged for continuous or semicontinuous flow.

10. A system in accordance with claim 1, 2, 3 or 4 in which said further raw material is water having a resistivity of at least about 15 megohm-cm at 25° C., less than about 25 ppb of electrolytes, a particulate content of less than about 150/cm$^3$, and a microorganism content of less than about 10/cm$^3$.

11. A system in accordance with claims 1, 2, 3 or 4 in which said means for combining said gaseous raw material and said further raw material is a member selected from the group consisting of a mist contactor, a burner and a catalytic reactor.

* * * * *